(12) United States Patent
Hwang

(10) Patent No.: US 7,701,768 B2
(45) Date of Patent: Apr. 20, 2010

(54) METHOD FOR PROGRAMMING MULTI-LEVEL CELL FLASH MEMORY DEVICE

(75) Inventor: Kyung-Pil Hwang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 278 days.

(21) Appl. No.: 11/966,451

(22) Filed: Dec. 28, 2007

(65) Prior Publication Data

US 2009/0003055 A1 Jan. 1, 2009

(30) Foreign Application Priority Data

Jun. 26, 2007 (KR) ............... 10-2007-0062954

(51) Int. Cl.
*G11C 16/04* (2006.01)
(52) U.S. Cl. .................. 365/185.17; 365/185.03
(58) Field of Classification Search ........... 365/185.17, 365/185.03, 185.12
See application file for complete search history.

(56) References Cited

U.S. PATENT DOCUMENTS

| 6,307,807 | B1 * | 10/2001 | Sakui et al. ............ 365/238.5 |
| 7,068,540 | B2 | 6/2006 | Micheloni et al. |
| 7,212,436 | B2 | 5/2007 | Li |
| 7,254,064 | B2 | 8/2007 | Kim et al. |
| 7,539,063 | B2 * | 5/2009 | Kang et al. ............ 365/185.22 |

FOREIGN PATENT DOCUMENTS

KR 100206696 B1 4/1999

* cited by examiner

*Primary Examiner*—Vu A Le
(74) *Attorney, Agent, or Firm*—Townsend and Townsend and Crew LLP

(57) ABSTRACT

A method for programming an MLC flash memory device minimizes interference between adjacent cells during a program operation, such that threshold voltage distribution becomes narrow and uniform. According to the method, an auxiliary program operation is performed on memory cells to be programmed, such that a majority of the memory cells have a positive threshold voltage. An LSB of a particular memory cell is programmed to a predetermined level, and data of the programmed LSB is sensed. An MSB of the particular memory cell is programmed to a predetermined level according to the sensed data of the LSB.

12 Claims, 10 Drawing Sheets

METHOD FOR PROGRAMMING MULTI-LEVEL CELL FLASH MEMORY DEVICE

CROSS-REFERENCE TO RELATED APPLICATIONS

The present application claims priority to Korean patent application number 10-2007-0062954, filed on Jun. 26, 2007, which is incorporated by reference in its entirety.

BACKGROUND OF THE INVENTION

The present invention relates to a method for operating a flash memory device, and more particularly, to a method for programming a multi-level cell (MLC) flash memory device.

Flash memory devices are non-volatile memory devices that are programmable and erasable, and are widely used for portable electronics (for example, MP3 players, digital cameras, camcorders, laptop computers, personal digital assistants (PDAs), mobile phones, etc.), computer basic input/output systems (BIOS), printers, USB drivers, etc.

NAND flash memory devices are becoming increasingly popular for use as data storage media. Thus, high capacity flash memory devices are in great demand. Recently, to increase storage capacity in a smaller chip size, research for a multi-bit cell storing more than 2 bits is being actively performed. The multi-bit cell is commonly called a multi-level cell (MLC). Unlike a single level cell (SLC) having a programmed state or an erased state (i.e., 2 bits) in each cell, the MLC can store three or more bits in each cell. Therefore, compared to the SLC, the MLC has at least twice the memory capacity of the SLC. The MLC typically includes more than two threshold voltage distributions, and more than two corresponding data storage states.

In an MLC flash memory device, threshold voltage distributions of a programmed state need to be spaced apart from each other between a first read voltage R1 and a pass voltage Vpass. Therefore, the width of the threshold voltage distributions is required to be as narrow as possible after programming.

A program operation of the flash memory device is accomplished by Fowler-Nordheim Tunneling. A predetermined program voltage is applied to a word line of selected memory cells, and a ground voltage is applied to a bit line thereof. To prevent unselected memory cells from being programmed, a power voltage Vcc is applied to a bit line of the unselected memory cells. Once the program voltage is applied to the word line and the ground voltage is applied to the bit line, a high electric field results between a floating gate and a channel of a memory cell. Thus, tunneling occurs, where electrons of a channel pass through a tunnel oxide between a floating gate and a channel due to the electric field. Thus, a threshold voltage of the memory cell rises because of accumulation of the electrons in the floating gate.

FIGS. 1A to 1D illustrate graphs of threshold voltage distributions when a conventional MLC flash memory device is programmed.

A program operation of the MLC flash memory device programs a least significant bit (LSB) first and then a most significant bit (MSB) through an incremental step pulse program (ISPP) method.

Referring to FIG. 1A, an LSB of a memory cell in a [11] state with a negative threshold voltage (i.e., an erased state) is programmed to a [10] state with a second program level.

FIG. 1B illustrates a change of a threshold voltage due to interference of adjacent cells after programming the memory cell of the [11] state to the [10] state. The right tail of the threshold voltage distribution shifts and the width between the right tail and the left tail increases.

As illustrated in FIG. 1C, to program to a [01] state (i.e., a first program level) and a [00] state (i.e., a third program level), an MSB of a memory cell in a [11] state is programmed to a [01] state of a first program level, and an MSB of a memory cell in a [10] state is programmed to a [00] state of a third program level.

FIG. 1D illustrates a change of threshold voltage distribution due to interference between adjacent cells after programming the MSB.

While programming an MLC flash memory device, the variation width of threshold voltage distribution is maximized because the greatest interference occurs from adjacent cells when programming a [11] state (i.e., an erased state) to a [01] state of a first program level. The reason is that it is difficult to accurately measure where a threshold voltage of an actual memory cell is placed in a negative region because a threshold voltage of a memory cell in a [11] state (i.e., an erased state) is negative. Accordingly, when programming a [11] state (an erased state) to a [01] state, a bias difference affecting adjacent cells is maximized. Thus, as illustrated in FIG. 1D, there is almost no margin between threshold voltage distribution and a read voltage R3 when a memory cell is programmed in a [10] state. Therefore, failure may easily occur during a read operation.

Accordingly, in order to provide a memory cell with a uniform narrow threshold voltage distribution after programming, interference of adjacent cells needs to be minimized by reducing a bias difference, which affects adjacent cells, to as small as possible while programming an erased state to a [01] state.

SUMMARY OF THE INVENTION

Embodiments of the present invention are directed to a method for programming an MLC flash memory device to provide a uniform and narrow threshold voltage distribution by minimizing interference of adjacent cells during a program operation of the MLC flash memory device.

In one embodiment, a method for programming an MLC flash memory device includes: performing an auxiliary program operation on a plurality of memory cells to be programmed, such that a majority of the memory cells have a positive threshold voltage; programming an LSB of a particular memory cell to a predetermined level; sensing data of the programmed LSB; and programming an MSB of the particular memory cell to a predetermined level according to the sensed data of the LSB.

In another embodiment, a method for programming an MLC flash memory device including a plurality of memory cells is disclosed. The method includes: programming an LSB of a particular memory cell to a predetermined level; performing an auxiliary program such that a majority of the plurality of memory cells have a positive threshold voltage, the plurality of memory cells being programmed from an erased state to a first program level; sensing LSB data of the particular memory cell; and programming an MSB of the particular memory cell to a predetermined level according to the sensed LSB data.

DESCRIPTION OF SPECIFIC EMBODIMENTS

A method for programming a multi-level cell (MLC) flash memory device in accordance with embodiments of the present invention will be described in detail with reference to the accompanying drawings.

A program operation of a flash memory device includes injecting electrons to a floating gate of a selected memory cell transistor and verifying whether a threshold voltage of the programmed memory cell transistor reaches a predetermined threshold voltage. The injecting of the electrons and the verifying of the predetermined threshold voltage are repeated on selected memory cells within a predetermined number of program operations until the predetermined threshold voltage is reached.

To obtain an MLC structure, it is important that the width of threshold voltage distribution in each programmed status is uniform and narrow within predetermined limits. Specifically, a program operation levels a threshold voltage of a memory cell in a [11] state (i.e., an erased state) to above 0 V, and then performs a main program operation. When programming the memory cell in an erased state, interference effects of adjacent cells can be minimized by reducing a bias difference with respect to the adjacent cells.

The program operation includes programming an LSB and programming an MSB when an MLC is capable of storing 2 bits of data. The programming of the LSB changes only LSB data in an erased state and then the LSB data becomes a [10] state. To reduce the variation width of a threshold voltage within predetermined limits when changing the erased state to the [01] state, the LSB is programmed after raising a negative threshold voltage of a memory cell in the erased state to above 0 V.

The programming of the MSB senses the programmed result of the LSB, and according to the result, programs the MSB. That is, if the programmed result of the LSB is 1, the MSB is programmed to 0 to be in a [01] state because a data storage state is [11]. If the programmed result of the LSB is 0, the MSB is programmed to 0 to be in a [00] state because a data storage state is [10].

Figure 1A:
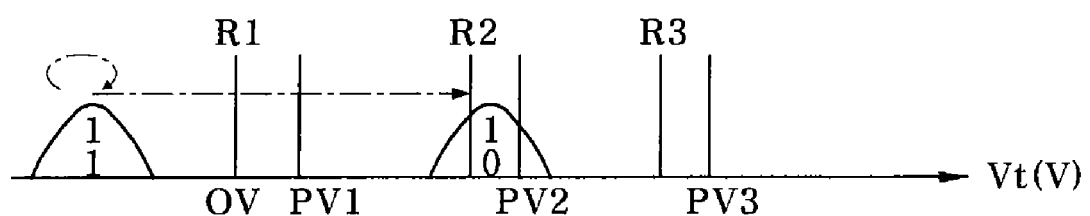
FIGS. 1A to 1D illustrate graphs of threshold voltage distributions when a conventional MLC flash memory device is programmed.
Figure 1B:
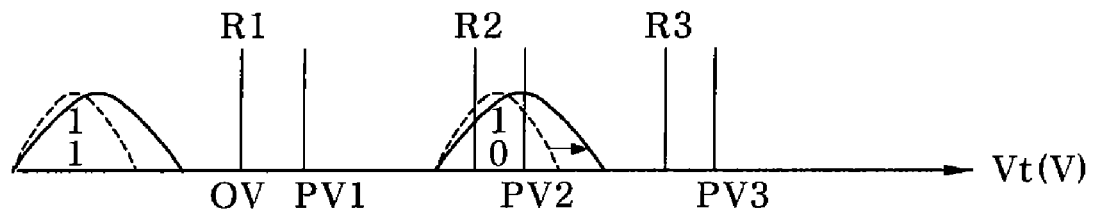
Figure 1C:
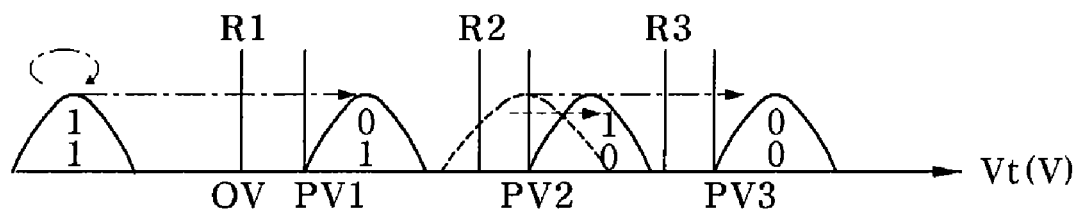
Figure 1D:
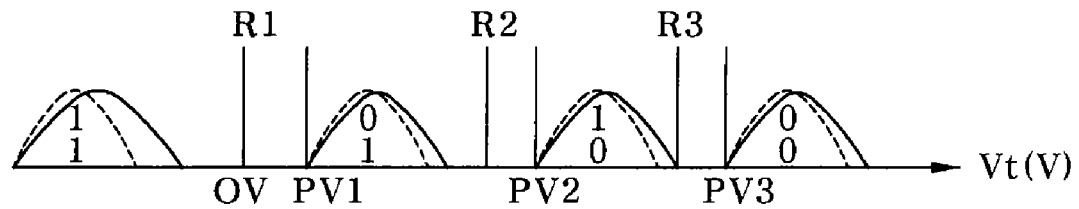
Figure 2:
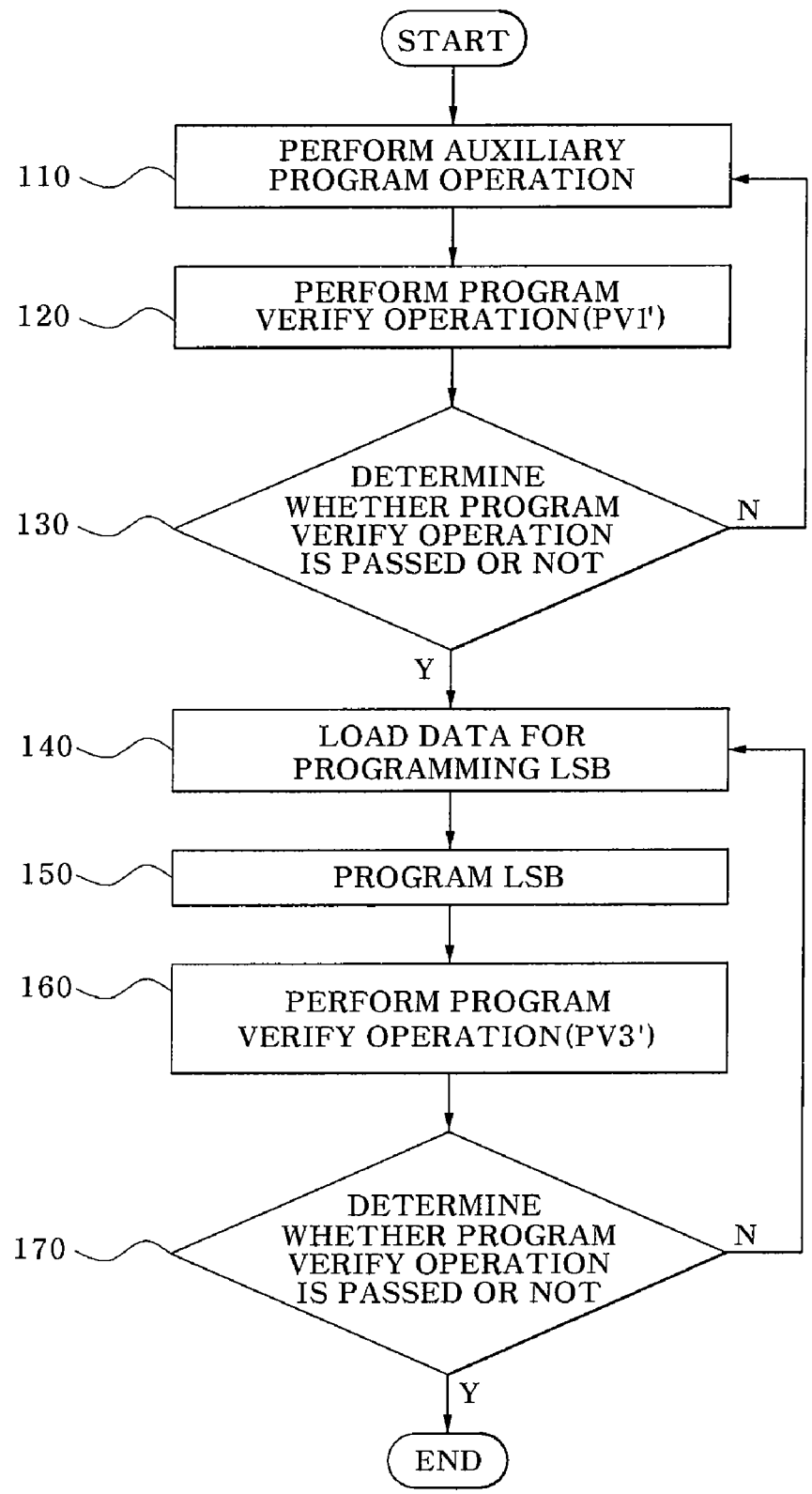
FIG. 2 illustrates a method for programming an LSB in an MLC flash memory device according to one embodiment of the present invention.

FIG. 2 illustrates a method for programming an LSB in an MLC flash memory device according to one embodiment of the present invention.

Figure 3A:
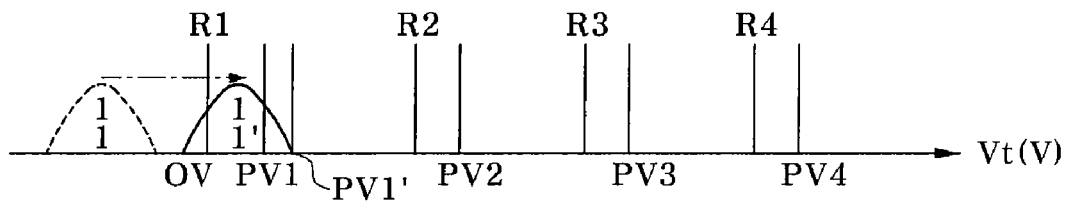
FIGS. 3A to 3D illustrate graphs of threshold voltage distributions in memory cells during an LSB program operation according to one embodiment of the present invention.

Once the LSB program operation starts, a predetermined program voltage is applied to word lines of all memory cells in a selected block of the MLC flash memory device to perform an auxiliary program operation in operation 110. This operation changes a threshold voltage of a memory cell to a [11'] state above 0 V to minimize a bias difference before performing a main program operation on an LSB. For the main program operation, a predetermined program voltage is applied to the word lines of all memory cells in the selected block, such that threshold voltages of a majority of the memory cells are above 0 V. That is, as illustrated in FIG. 3A, the right tail of the threshold voltage distribution of the memory cells has a positive value above 0 V.

It is verified whether the memory cells are programmed to a predetermined level after applying a program pulse in operation 120. Then it is determined whether the verify operation passed in operation 130. A verify voltage PV1' above 0 V is applied in operation 120. According to the verified result, if at least one memory cell in the selected block surpasses the verify voltage PV1', the verify operation passes. Otherwise, the verify operation fails.

If the verify operation fails, the program and verify operations repeat in a loop by increasing a program voltage by a step voltage according to a conventional incremental step pulse program (ISPP) method.

The verify operation passes when the memory cell is programmed to a predetermined level, and a main program operation is performed on the LSB of the memory cell. First, data is loaded to program the LSB of the memory cell in operation 140. Next, a predetermined program voltage is applied to a word line of memory cells to program an LSB of the memory cell in operation 150. After programming the LSB, it is verified whether the memory cell is programmed to a predetermined level in operations 160 and 170. The verify operation uses a voltage PV3 as a verify voltage. The voltage PV3 is used to verify a [10] state with a second program level. According to the verified result, if the memory cell is programmed to the predetermined level, the program operation for the LSB is terminated. If the memory cell is not programmed to the predetermined level, the verify operation repeats in a loop by increasing a program voltage by a step voltage according to the conventional ISPP method until the predetermined level is achieved.

FIGS. 3A to 3D illustrate graphs of threshold voltage distributions in memory cells during an LSB program operation according to one embodiment of the present invention.

Figure 3B:
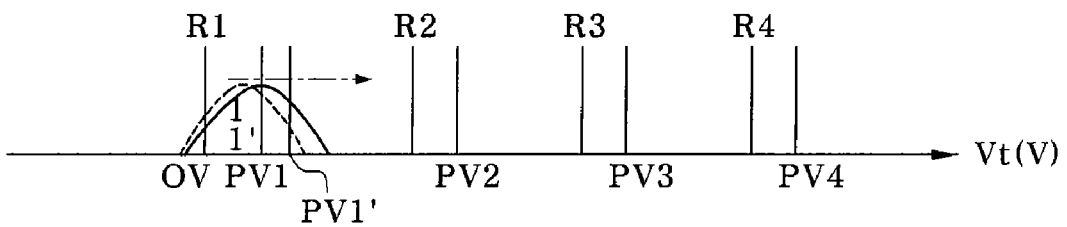

FIG. 3A illustrates threshold voltage distribution of a memory cell during an auxiliary program operation for changing an erased state to a [11'] state. FIG. 3B illustrates a change of threshold voltage distribution, which is caused due to the interference of adjacent cells in the [11'] state.

Figure 3C:
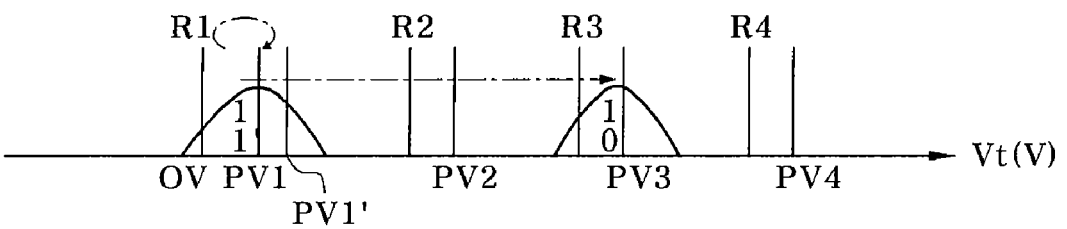
Figure 3D:
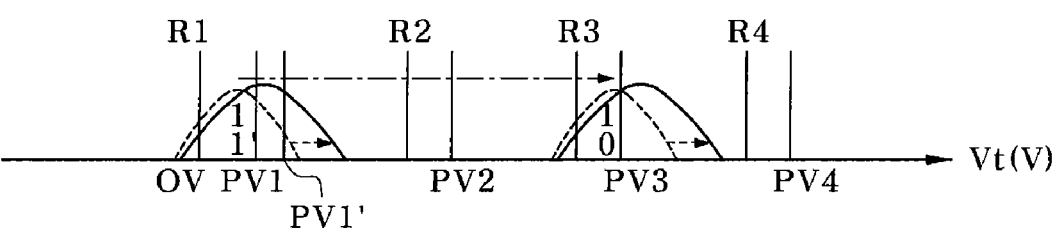

FIG. 3C illustrates threshold voltage distribution when a main program operation is performed on an LSB of a memory cell that is programmed in the [11'] state by an auxiliary program operation. FIG. 3D illustrates a change of threshold voltage distribution, which is caused due to the interference of adjacent cells after programming the LSB.

A bias difference affecting adjacent cells is reduced while programming the [11'] state to a [10] state such that a change of threshold voltage distribution in the memory cell decreases. Likewise, because a main program operation is performed on the LSB after programming the memory cell in an erased state to the [11'] state with a threshold voltage above 0 V during an initial program operation of the MLC flash memory device, interference due to adjacent cells is reduced such that the variation width of a threshold voltage in a cell is decreased.

Figure 4:
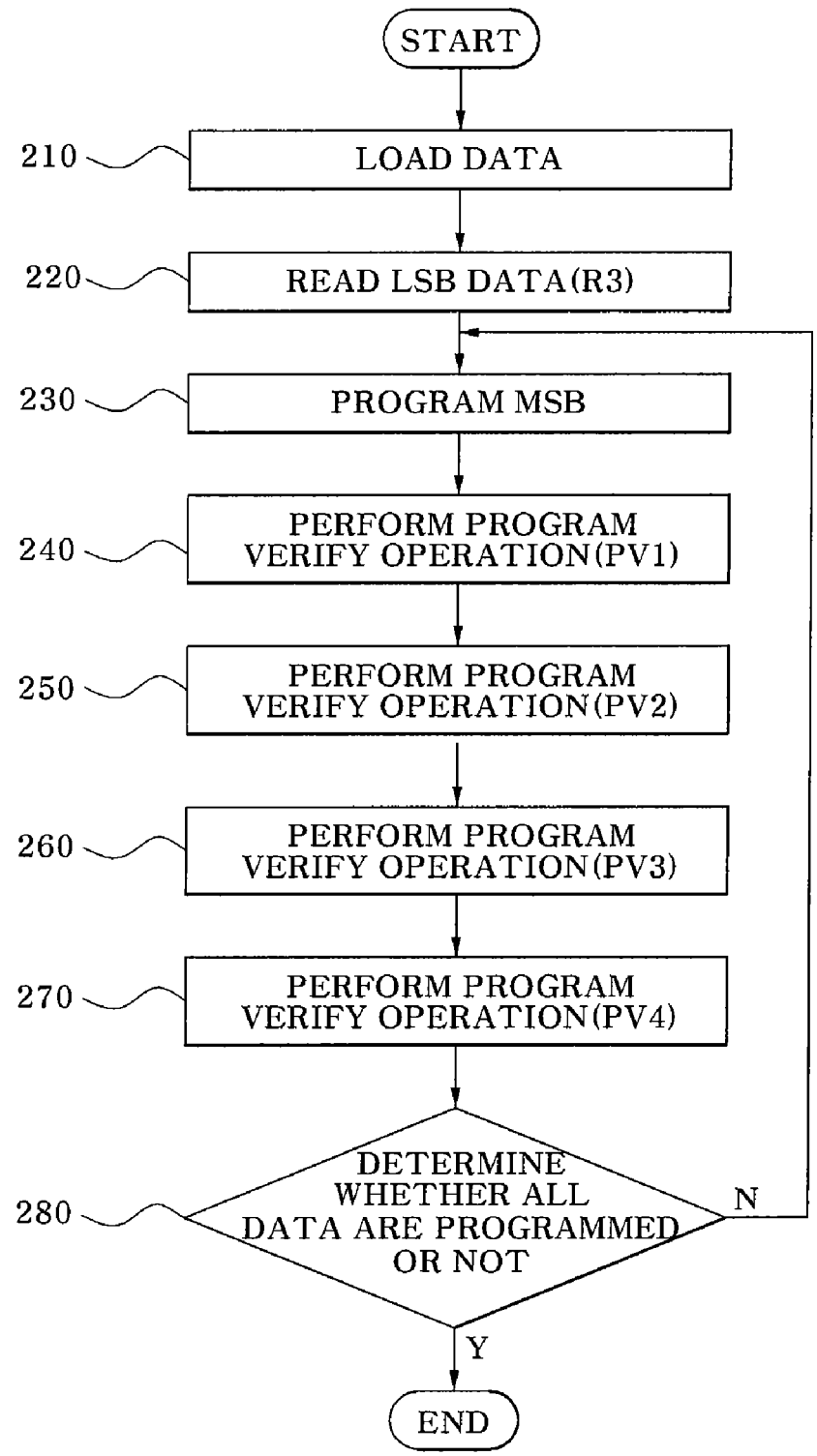
FIG. 4 illustrates a method for programming an MSB in an MLC flash memory device according to one embodiment of the present invention.

FIG. 4 illustrates a method for programming an MSB in an MLC flash memory device according to one embodiment of the present invention.

Once an MSB is programmed, data is loaded to read LSB data in operation 210. Because a program voltage needs to be set differently according to an LSB state, a data value of the loaded LSB is read in operation 220. A voltage R3 distinguishing a second program level from a third program level is used as a read voltage.

After reading the LSB data, the MSB is programmed according to the read LSB data result in operation 230. If the LSB data is 0, the MSB is programmed to be in a [00] state because the memory cell is in a [10] state. If the LSB data is 1, MSB is programmed to be in a [01] state because the memory cell is in a [11'] state.

After programming the MSB, it is determined whether the memory cell is programmed to a predetermined level in operations 240 to 280. According to a level to be programmed, first to fourth verify voltages PV1 to PV4 are used for verification.

When all memory cells are programmed to the predetermined level, the program operation is terminated. If there is a memory cell that is not programmed to the predetermined level, like the LSB, the program and verify operations repeat in a loop by increasing a program voltage by a predetermined step voltage according to the conventional ISPP method until the predetermined level is achieved.

Figure 5:
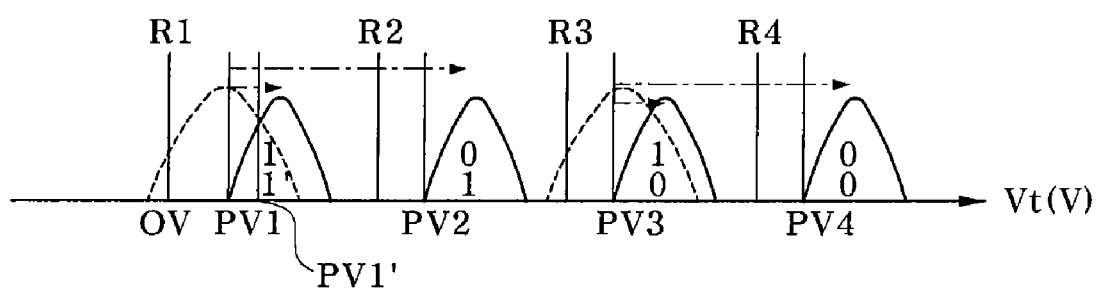
FIG. 5 illustrates a graph of threshold voltage distributions in memory cells when programming an MSB of an MLC flash memory device according to one embodiment of the present invention.

FIG. 5 illustrates a graph of threshold voltage distributions in memory cells when programming an MSB of an MLC flash memory device according to one embodiment of the present invention.

The left portion of FIG. 5 illustrates a process of programming an MSB of a memory cell in a [11'] state to a [01] state, and the right portion of FIG. 5 illustrates a process of programming an MSB of a memory cell in a [10] state to a [00] state.

Figure 6:
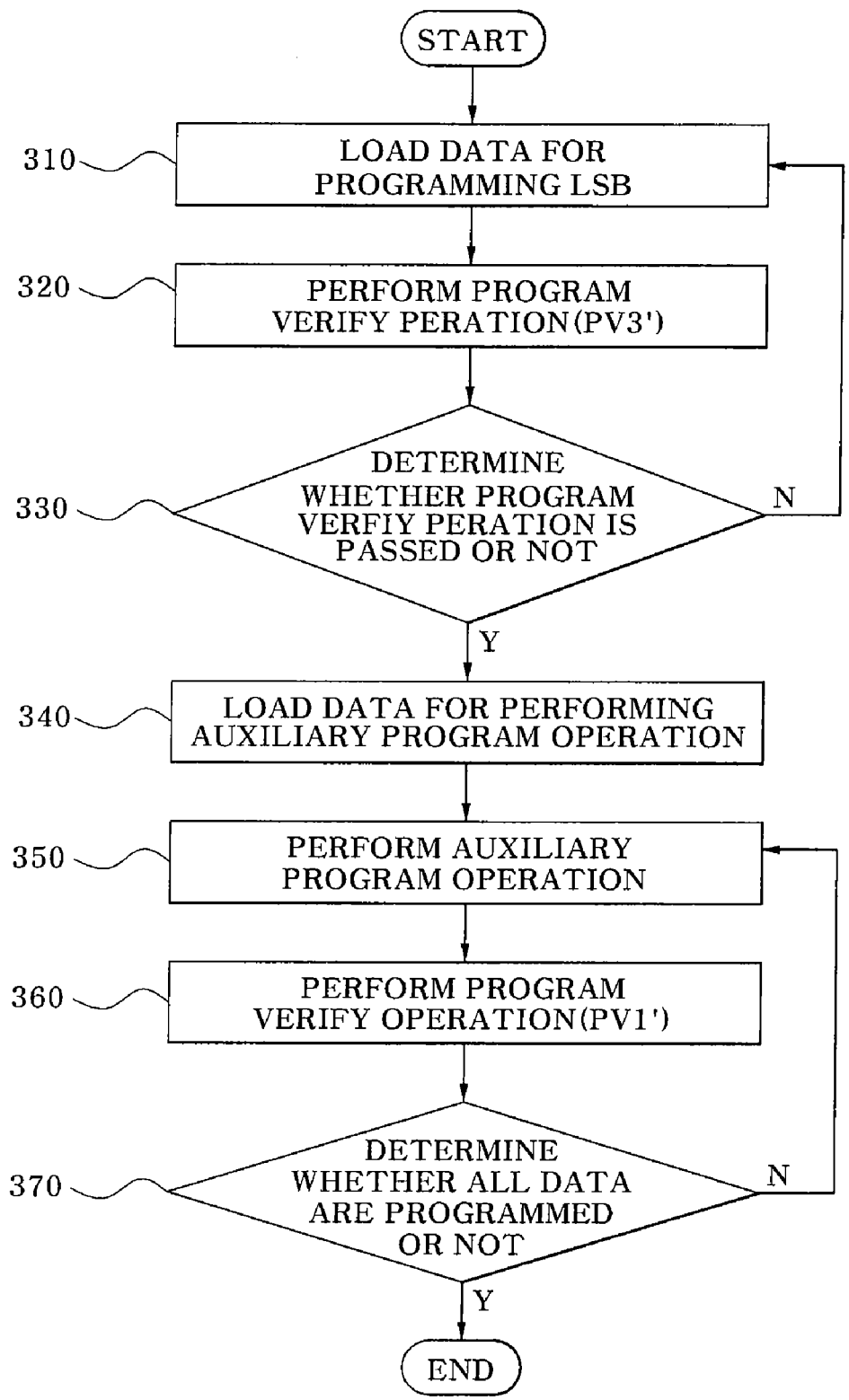
FIG. 6 illustrates a method for programming an LSB of an MLC flash memory device according to another embodiment of the present invention.
Figure 7A:
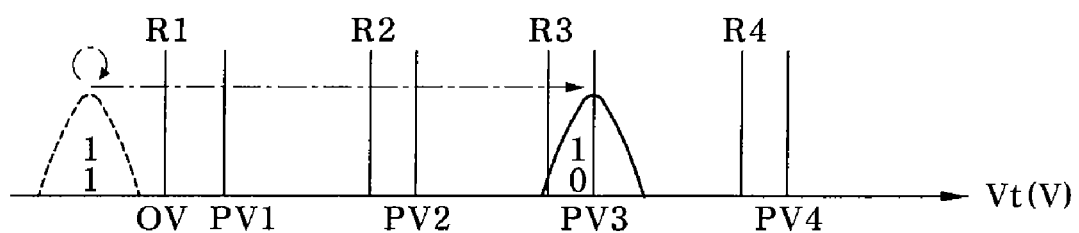
FIGS. 7A and 7B illustrate graphs of threshold voltage distributions in memory cells during the programming of the LSB in FIG. 6.
Figure 7B:
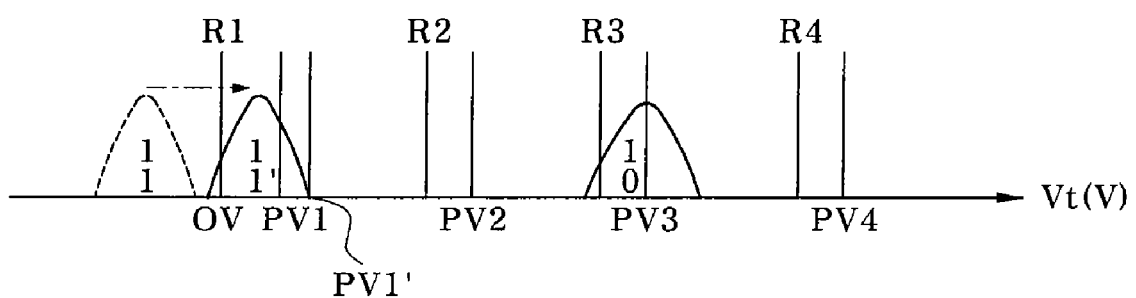

FIG. 6 illustrates a method for programming an LSB of an MLC flash memory device according to another embodiment of the present invention. FIGS. 7A and 7B illustrate graphs of threshold voltage distributions in memory cells during the programming of the LSB in FIG. 6.

In this embodiment, a method is provided for performing an auxiliary program operation that raises a threshold voltage of a memory cell above a predetermined level after a main program is performed on an LSB of a memory cell in a [11] state with a negative threshold voltage. That is, after programming the LSB, the auxiliary program operation is performed before programming the MSB.

Referring to FIG. 6, once a program operation initiates, data is loaded to program an LSB. The LSB is programmed using a predetermined voltage as a program start voltage in operation 310. A state of a memory cell is verified using a third verify voltage PV3' and it is determined whether the verify operation passes in operations 320 and 330.

If the verify operation does not pass, the LSB is programmed by increasing a program voltage by a predetermined step voltage until the verify operation passes.

If the verify operation passes when all memory cells are programmed to a predetermined level, data is loaded to perform an auxiliary program operation for raising a threshold voltage of a memory cell in operation 340. After loading the data, a predetermined program voltage is applied to a word line of memory cells that will be programmed from a [11] state to a [01] state in operation 350. It is determined whether the memory cell is programmed using PV1' as a verify voltage in operations 360 and 370. If the verify operation passes, the program operation is terminated. Otherwise, the program and verify operations repeat until the verify operation passes according to the ISPP method.

Figure 8:
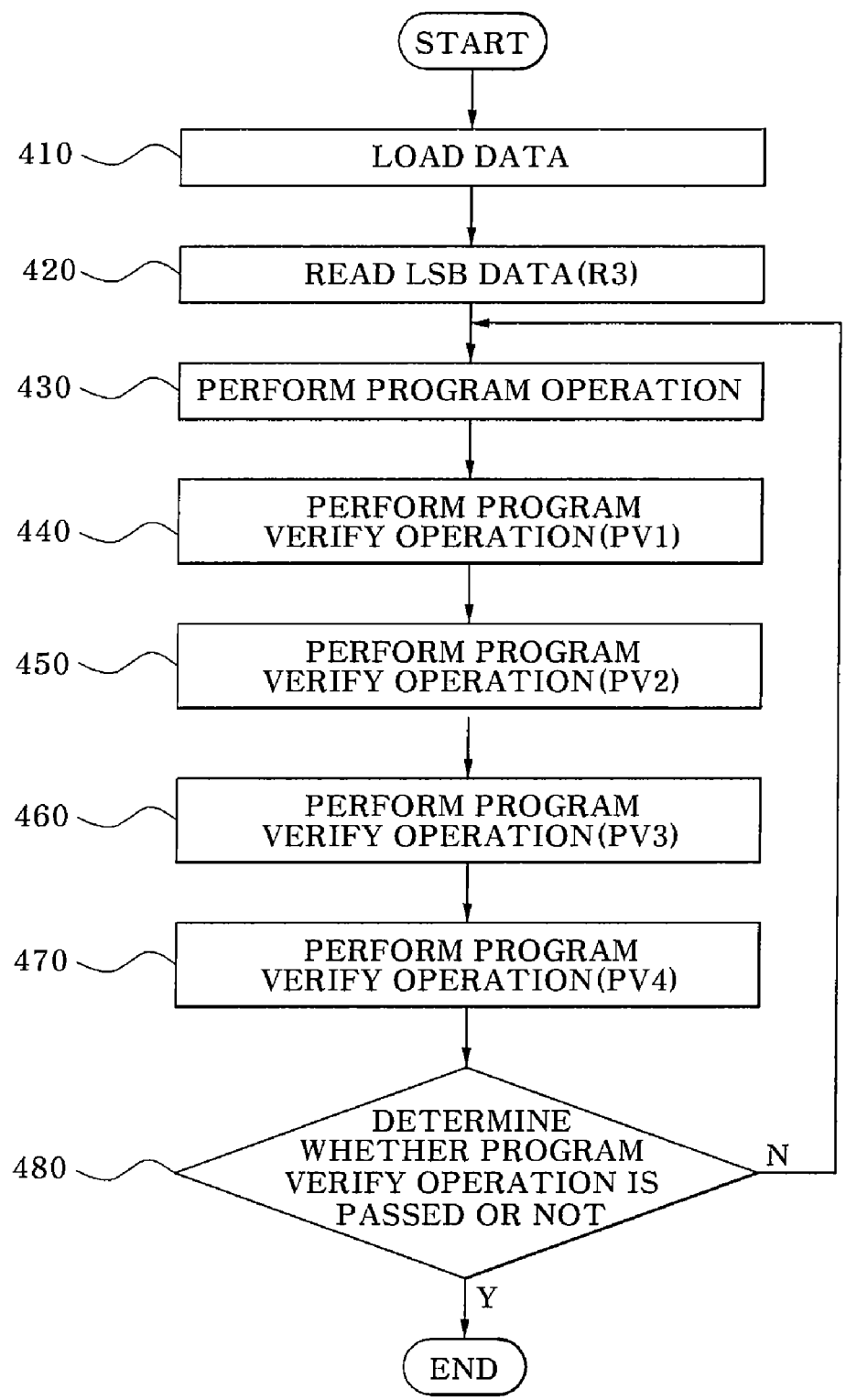
FIG. 8 illustrates a method for programming an MSB of an MLC flash memory device according to another embodiment of the present invention.

FIG. 8 illustrates a method for programming an MSB of an MLC flash memory device according to another embodiment of the present invention.

Once the MSB is programmed, data is loaded to read LSB data in operation 410. Because a program voltage needs to be set differently according to the LSB data, a data value of the loaded LSB data is read in operation 420. A voltage R3 distinguishing a second program level from a third program level is used as a read voltage. After reading the LSB data, the MSB is programmed according to the read LSB data result in operation 430. If the LSB data is 0, the MSB is programmed to be in a [00] state because the memory cell is in a [10] state. If the LSB data is 1, the MSB is programmed to be in a [01] state because the memory cell is in a [11'] state.

After programming the MSB, it is determined whether the memory cell is programmed to a predetermined level in operations 440 to 470. According to a level to be programmed, first to fourth verify voltages PV1 to PV4 are used for verification.

According to the verified result, it is determined whether the verify operation passes in operation 480. When all memory cells are programmed to a predetermined level, a program operation is terminated. If there is a memory cell that is not programmed to the predetermined level, like the LSB, the program and verify operations repeat in a loop by increasing a program voltage by a predetermined step voltage until the predetermined level is achieved according to the conventional ISPP method.

Figure 9:
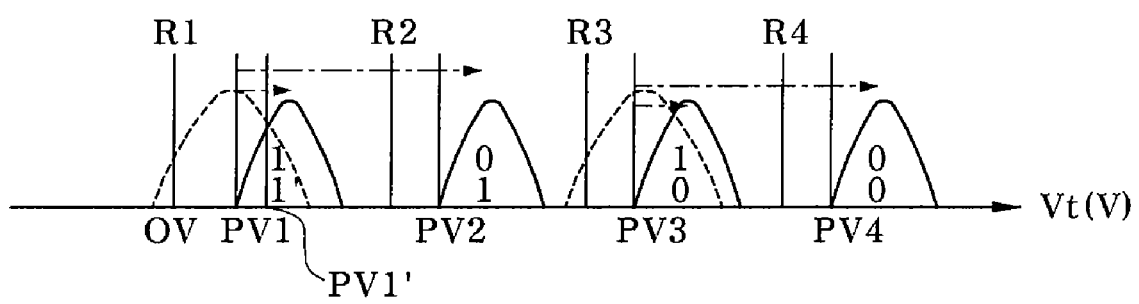
FIG. 9 illustrates a graph of a threshold voltage distribution of a memory cell during the programming of the MSB in FIG. 8.

FIG. 9 illustrates a graph of a threshold voltage distribution of a memory cell during the programming of the MSB in FIG. 8.

The left portion of FIG. 9 illustrates a process of programming an MSB of a memory cell in a [11] state to a [01] state, and the right portion of FIG. 9 illustrates a process of programming an MSB of a memory cell in a [10] state to a [00] state.

The programming method may be effectively applicable to various kinds of MLC flash memories.

According to the present invention, the method for programming an MLC flash memory device performs an auxiliary program operation, such that a memory cell in an erased state has a positive threshold voltage before or after programming an LSB during an initial program operation. As a result, because interference due to adjacent cells is reduced, the variation widths of threshold voltages are decreased and threshold voltage distributions become narrow and uniform.

The embodiments of the present invention have been disclosed above for illustrative purpose. Those skilled in the art will appreciate that various modifications, additions and substitutions are possible, without departing from the scope and spirit of the invention as disclosed in the accompanying claims.

What is claimed is:

1. A method for programming a multi-level cell (MLC) flash memory device, the method comprising:
performing an auxiliary program operation on a plurality of memory cells to be programmed, such that a majority of the memory cells have a positive threshold voltage;
programming a least significant bit (LSB) of a particular memory cell to a predetermined level;
sensing data of the programmed LSB; and programming a most significant bit (MSB) of the particular memory cell to a predetermined level according to the sensed data of the LSB.

2. The method of claim 1, wherein performing the auxiliary program operation comprises:

applying a program voltage to memory cells in a selected block of the plurality of memory cells, wherein the particular memory cell is included in the selected block;

verifying a programmed state of the particular memory cell; and terminating the auxiliary program operation if the programmed state of the particular memory cell is verified, otherwise, reprogramming the particular memory cell by increasing the program voltage by a step voltage.

3. The method of claim 2, wherein verifying the programmed state verifies that the particular memory cell is programmed if there is at least one memory cell having a threshold voltage above a verify voltage among the memory cells in the selected block.

4. The method of claim 1, wherein programming the LSB and MSB of the particular memory cell is performed through an incremental step pulse program (ISPP) method.

5. The method of claim 2, further comprising, before performing the auxiliary program operation, erasing data of the particular memory cell in the selected block.

6. The method of claim 1, wherein programming the MSB of the memory cell comprises using different program start voltages according to the sensed data of the LSB for programming.

7. A method for programming an MLC flash memory device including a plurality of memory cells, the method comprising:

programming an LSB of a particular memory cell of a plurality of memory cells to a predetermined level;

performing an auxiliary program such that a majority of the plurality of memory cells have a positive threshold voltage, the plurality of memory cells being programmed from an erased state to a first program level;

sensing LSB data of the particular memory cell; and programming an MSB of the particular memory cell to a predetermined level according to the sensed LSB data.

8. The method of claim 7, wherein performing the auxiliary program comprises:

applying a program voltage to the particular memory cell, the particular memory cell being programmed from an erased state to a first program level;

verifying a programmed state of the particular memory cell; and terminating the auxiliary program if the programmed state of the particular memory cell is verified, otherwise, reprogramming the particular memory cell by increasing the program voltage by a predetermined step voltage.

9. The method of claim 8, wherein verifying the programmed state verifies that that the particular memory cell is programmed if there is at least one memory cell having a threshold voltage above a verify voltage among the plurality of memory cells.

10. The method of claim 7, wherein programming the LSB and MSB of the particular memory cell is performed through an ISPP method.

11. The method of claim 7, wherein programming the MSB of the particular memory cell comprises using different program start voltages according to the sensed LSB data for programming.

12. The method of claim 7, further comprising, before programming the LSB of the particular memory cell to the predetermined level, erasing data of the particular memory cell.

* * * * *